(12) United States Patent
Hild et al.

(10) Patent No.: US 11,029,515 B2
(45) Date of Patent: Jun. 8, 2021

(54) OPTICAL ELEMENT, AND METHOD FOR CORRECTING THE WAVEFRONT EFFECT OF AN OPTICAL ELEMENT

(71) Applicant: Carl Zeiss SMT GmbH, Oberkochen (DE)

(72) Inventors: Kerstin Hild, Waldstetten (DE); Toralf Gruner, Aalen (DE); Vitaliy Shklover, Heidenheim (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 0 days.

(21) Appl. No.: 17/008,229

(22) Filed: Aug. 31, 2020

(65) Prior Publication Data
US 2020/0393673 A1    Dec. 17, 2020

Related U.S. Application Data

(63) Continuation of application No. PCT/EP2019/054164, filed on Feb. 20, 2019.

(30) Foreign Application Priority Data

Mar. 5, 2018 (DE) ..................... 10 2018 203 241.6

(51) Int. Cl.
*G02B 27/00* (2006.01)
*G03F 7/20* (2006.01)
*G02B 7/20* (2021.01)

(52) U.S. Cl.
CPC ..... *G02B 27/0068* (2013.01); *G03F 7/70308* (2013.01); *G03F 7/70316* (2013.01)

(58) Field of Classification Search
CPC .. G02B 5/0816; G02B 5/0891; G02B 7/0068; G02B 27/0068; G03F 7/70308; G03F 7/70316
(Continued)

(56) References Cited

U.S. PATENT DOCUMENTS

| 4,876,667 A | 10/1989 | Ross et al. |
| 4,900,598 A | 2/1990 | Suzuki |

(Continued)

FOREIGN PATENT DOCUMENTS

| DE | 3832126 A1 | 3/1989 |
| DE | 19956353 C1 | 8/2001 |

(Continued)

OTHER PUBLICATIONS

International Search Report, PCT/EP2019/054164, dated Jun. 6, 2019, 4 pages.

(Continued)

*Primary Examiner* — Hung Nguyen
(74) *Attorney, Agent, or Firm* — Edell, Shapiro & Finnan, LLC

(57) ABSTRACT

An optical element for an optical system, in particular an optical system of a microlithographic projection exposure apparatus or mask inspection apparatus, and a method for correcting the wavefront effect of an optical element. The optical element has at least one correction layer (12, 22) and a manipulator that manipulates the layer stress in this correction layer such that a wavefront aberration present in the optical system is at least partially corrected by this manipulation. The manipulator has a radiation source for spatially resolved irradiation of the correction layer with electromagnetic radiation (5). This spatially resolved irradiation enables a plurality of spaced apart regions (12a, 12b, 12c, . . . ; 22a, 22b, 22c, . . .) to be generated, equally modified in terms of their respective structures, in the correction layer.

15 Claims, 4 Drawing Sheets

(58) Field of Classification Search
USPC .................................................. 359/350; 355/67
See application file for complete search history.

(56) References Cited

U.S. PATENT DOCUMENTS

| | | | |
|---|---|---|---|
| 6,521,877 | B1 | 2/2003 | Mueller-Rissmann et al. |
| 6,844,272 | B2 | 1/2005 | Taylor et al. |
| 8,508,854 | B2 | 8/2013 | Eva et al. |
| 8,891,172 | B2 | 11/2014 | Eva et al. |
| 9,063,277 | B2 | 6/2015 | Masaki et al. |
| 9,249,501 | B2 | 2/2016 | Ehm et al. |
| 9,470,872 | B2 | 10/2016 | Bittner et al. |
| 10,474,036 | B2 | 11/2019 | Paul et al. |
| 2008/0062397 | A1* | 3/2008 | Nam .................. G03F 7/706 355/66 |
| 2014/0078481 | A1* | 3/2014 | Mueller ............ G02B 5/0891 355/67 |
| 2017/0315452 | A1 | 11/2017 | Hild et al. |
| 2020/0026195 | A1 | 1/2020 | Lippert et al. |

FOREIGN PATENT DOCUMENTS

| | | |
|---|---|---|
| DE | 102005044716 A1 | 4/2007 |
| DE | 102006045075 A1 | 4/2008 |
| DE | 102011090192 A1 | 7/2012 |
| DE | 102011076014 A1 | 8/2012 |
| DE | 102014219755 A1 | 4/2015 |
| DE | 102014204171 A1 | 9/2015 |
| DE | 102014224569 A1 | 6/2016 |
| DE | 102015200328 A1 | 7/2016 |
| EP | 0307750 A1 | 3/1989 |
| EP | 0217293 B1 | 4/1994 |
| EP | 1103857 B1 | 9/2006 |
| JP | 60124037 A | 7/1985 |
| WO | 2016087092 A1 | 6/2016 |
| WO | 2016113117 A1 | 7/2016 |
| WO | 2018177649 A1 | 10/2018 |

OTHER PUBLICATIONS

International Preliminary Report on Patentability with Written Opinion, International Application No. PCT/EP2019/054164 dated Sep. 8, 2020, with English Translation, 20 pages.

German Office Action with English translation, Application No. 10 2018 203 241.6, dated Jul. 30, 2018, 12 pages.

Yin, D., et al., "Numerical Modelling of Multilayered Coatings—Latest Developments and Applications", Manufacturing Rev. 2014, 1, 8 , pp. 1-14, Published by EDP Sciences, 2014 DOI: 10.1051/mfreview/2014008.

Cheng, X., "Thermal stress issues in thin film coatings of X-ray optics under high heat load", Physics, Université de Grenoble, 2014, pp. 1-144 [NNT: 2014GRENY028].

Kolobov, A.V. et al., "Understanding Phase-Change Memory Alloys from a Chemical Perspective", Scientific Reports 5, 13698, Sep. 1, 2015, pp. 1-11.

Doerner, M, et al., "Stresses and deformation processes in thin films on substrates", vol. 14, Issue 3 (1988), pp. 225-268.

Windischmann, H., "Intrinsic stress in sputter-deposited thin films", Critical Reviews in Solid State and Materials Sciences 17(6):547-596 (1992), pp. 547-596.

Cammarata, R, "Surface and interface stress effects in thin films", Progress in Surface Science, vol. 46, No. 1, pp. 1-38, (1994).

Nix, W.D., et al., "Crystallite coalescence: A mechanism for intrinsic tensile stresses in thin films", Journal of materials research, Aug. 1999, vol. 14, Issue 8, pp. 3467-3473.

Chason, E. et al., "Tutorial: Understanding residual stress in polycrystalline thin films through real-time measurements and physical models", Journal of Applied Physics 119, 191101 (2016), 191101-1 to 19101-21.

Johlin, E. et al., "Structural origins of intrinsic stress in amorphous silicon thin films", Physical Review B 85, 075202 (2012), 075202-1 to 075202-7.

* cited by examiner

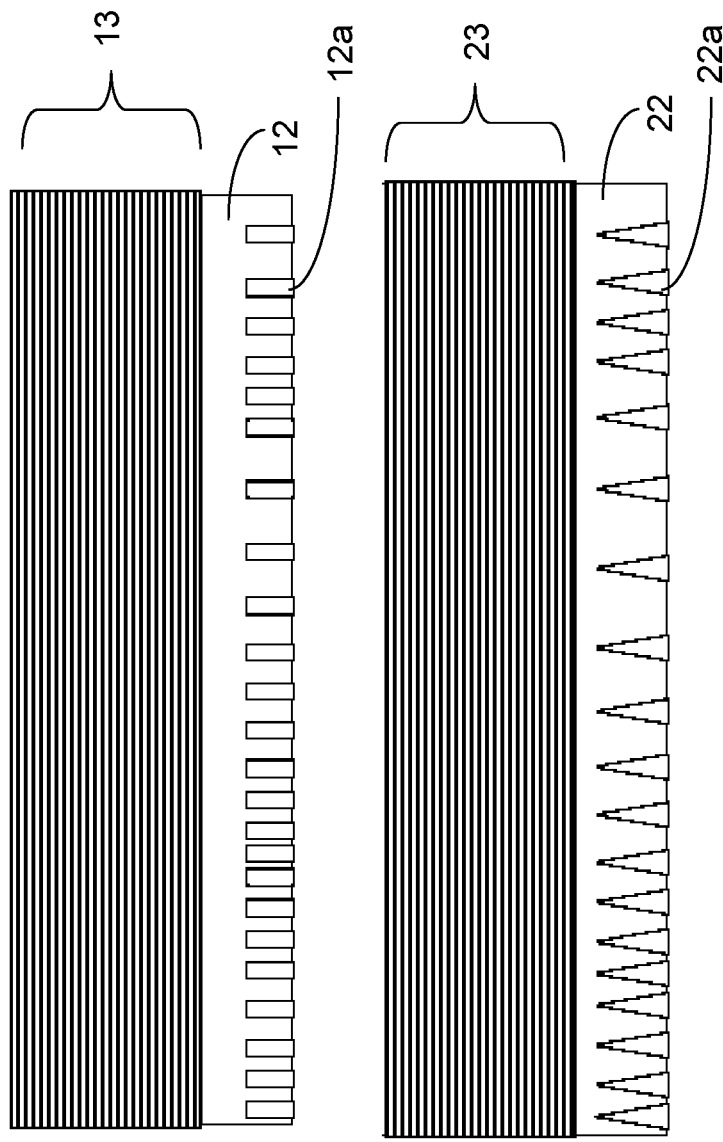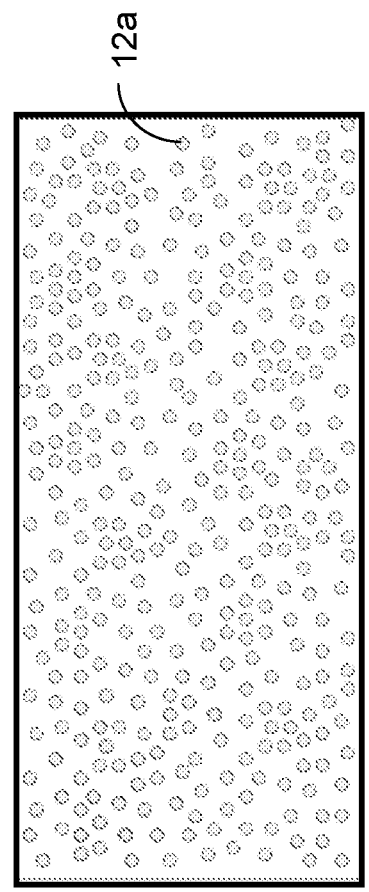

OPTICAL ELEMENT, AND METHOD FOR CORRECTING THE WAVEFRONT EFFECT OF AN OPTICAL ELEMENT

CROSS REFERENCE TO RELATED APPLICATIONS

This is a Continuation of International Application PCT/EP2019/054164, which has an international filing date of Feb. 20, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 203 241.6 filed on Mar. 5, 2018.

FIELD OF THE INVENTION

The invention relates to an optical element for use in an optical system, in particular in an optical system of a microlithographic projection exposure apparatus or mask inspection apparatus, and a method for correcting the wavefront effect of an optical element.

BACKGROUND

Microlithography is used for producing microstructured components such as, for example, integrated circuits or LCDs. The microlithography process is conducted in what is called a projection exposure apparatus, which comprises an illumination device and a projection lens. The image of a mask (=reticle) illuminated with the illumination device is projected with the projection lens onto a substrate (e.g., a silicon wafer) coated with a light-sensitive layer (photoresist) and arranged in the image plane of the projection lens, in order to transfer the mask structure to the light-sensitive coating of the substrate.

Mask inspection apparatuses are used for the inspection of reticles for microlithographic projection exposure apparatuses.

In projection lenses or inspection lenses designed for the extreme ultraviolet (EUV) range, i.e., at wavelengths of, e.g., approximately 13 nm or approximately 7 nm, owing to the lack of availability of suitable light-transmissive refractive materials, reflective optical elements are used as the optical components for the imaging process.

In this context, it is known, inter alia, to provide a wavefront correction layer on a reflective optical element, the thickness profile of which wavefront correction layer is set after the fact, in order to correct a wavefront aberration that occurs during the operation of the optical system. Furthermore, for example, it is known to use a film element operated in transmission as an additional optical wavefront correction element, which film element causes a desired wavefront correction by way of varying the layer thickness profile of the film element.

In relation to the prior art, reference is made merely by way of example to U.S. Pat. No. 6,844,272 B2, DE 10 2011 090 192 A1, U.S. Pat. No. 9,063,277 B2, DE 10 2005 044 716 A1, DE 10 2015 200 328 A1, DE 10 2014 224 569 A1, U.S. Pat. No. 8,508,854 B2, DE 38 32 126 A1, U.S. Pat. No. 4,876,667 and EP 0 217 293 B1.

SUMMARY

It is an object of the present invention to provide an optical element for use in an optical system, in particular in an optical system of a microlithographic projection exposure apparatus or a mask inspection apparatus, and a method for correcting the wavefront effect of an optical element, which provide a wavefront correction effect that is as precisely adjustable as possible with comparatively little structural outlay.

This object is achieved by the optical elements and the methods disclosed and claimed herein.

An optical element according to the invention for use in an optical system, in particular in an optical system of a microlithographic projection exposure apparatus or a mask inspection apparatus, comprises:
  at least one correction layer; and
  a manipulator for manipulating the layer stress in this correction layer such that a wavefront aberration present in the optical system is at least partially corrected by this manipulation;
  wherein the manipulator has a radiation source for spatially resolved irradiation of the correction layer with electromagnetic radiation; and
  wherein this spatially resolved irradiation enables a plurality of spaced apart regions to be generated, modified equally in terms of their respective structures in the correction layer.

In particular, the invention makes use of the concept of generating a desired wavefront correction by exploiting in a targeted fashion and/or by manipulating in a suitable way the layer stress that occurs in a correction layer of an optical element. In particular, the wavefront effect of the optical element is set as desired through the deformation of the optically effective surface that accompanies a change in the layer stress.

Consequently, the invention differs from conventional approaches by virtue of the fact that, in particular, the layer stress occurring in an optical element (such as a mirror or a lens element) is not considered for example a parasitic effect or a disturbance parameter that should be minimized but is instead deliberately exploited to set a desired wavefront effect and manipulated in a targeted fashion. Here, as yet to be explained in more detail below, this can be based, in particular, on an appropriate model which describes the dependence of the wavefront effect on the local distribution of this layer stress. Accordingly, it is possible, on the basis of this model, to calculate a corresponding local distribution of the layer stress for obtaining a desired wavefront effect or for changing the figure of the relevant optical element (i.e., the deviation from a set target shape of the surface).

In embodiments of the invention, the manipulation of the layer stress is obtained by changing the layer structure in this correction layer. In particular, this change in the layer structure can be at least partially irreversible.

Accordingly, the invention differs from conventional approaches in that, in particular, a structural change in the relevant correction layer (within the meaning of a permanent change in the texture or crystal structure) is brought about deliberately, and not, for instance, only a temporary change, e.g., in the form of a thermal expansion. Consequently, the effect according to the invention differs, in particular, from (bimetal) effects which are caused by differences in the coefficient of thermal expansion between a substrate material and a layer or a layer system situated thereon.

In contrast to such conventional approaches, preferably at least 50% of the change in the figure of the relevant optical element is brought about according to the invention by the change in the layer stress that arises from the structural change of the relevant correction layer.

According to one embodiment, a layer stress change of at least 10%, in particular of at least 20%, is generated during the manipulation of the layer stress over a lateral distance of 10 mm, in particular over a lateral distance of 1 mm, in the correction layer. According to the invention, comparatively pronounced gradients can be generated hereby in the layer stress change.

Physical effects suitable for manipulating the layer stress include, for example, the manipulation of the grain size via recrystallization or grain growth, the lateral variation of the density, e.g., by relaxation at grain boundaries or shrinking of cavities, the variation of the component of a phase, e.g., by phase transformations or precipitation, effects of foreign atoms or absorbed atoms (e.g., noble gases, hydrogen, water vapor, etc.) and also voids or displacements and the manipulation of energy and flow of charged particles in sputtering processes carried out to generate the layer.

According to one embodiment, the correction layer that is manipulated according to the invention in respect of the layer stress is an auxiliary layer that is provided in addition to a respective optically effective layer system of the optical element. Such an embodiment is advantageous in that the modification of the layer stress according to the invention need not immediately be accompanied by an unwanted change in certain properties of the optically effective layer system (e.g., of a reflection layer system of a mirror) such as, e.g., the service life thereof, the stability of the interfaces present in said layer system or further optical properties.

Consequently, according to the invention, in particular at least one correction layer is used for manipulating or subsequently correcting the layer stress in an optical element, said correction layer being accessible, for example, from the side (e.g., a mirror back side) distant from the optically effective surface of the optical element. Here, the manipulation of the layer stress, in particular, can be an irreversible change of the correction layer or the layer structure thereof such that, after the manufacture of the optical element according to the invention has been completed, a single (post) treatment can be carried out for the purposes of correspondingly changing the figure by manipulating the layer stress. In further embodiments, a plurality of layers or layer regions, each being accordingly irreversibly manipulatable once in terms of its layer stress, could also be provided in the optical element.

However, the invention is not restricted to the presence of such an additional auxiliary layer. Thus, in further embodiments, a (functional) layer, present in the optical system in any case for the purposes of obtaining a certain effect, can be used as a correction layer and can be manipulated in targeted fashion in respect of the layer stress.

According to the invention, the manipulator, present according to the invention for the purposes of manipulating the layer stress, comprises a radiation source for spatially resolved irradiation of the correction layer with electromagnetic radiation. Here, this spatially resolved irradiation renders it possible to generate a plurality of spaced apart regions, equally modified in terms of their respective structures.

According to this approach, the invention contains the further concept of realizing the manipulation of the layer stress, implemented with the object of the wavefront correction, by virtue of spatially resolved, locally restricted structure modifications being generated within the relevant correction layer by electromagnetic radiation modifying the relevant layer material, for example in each case in terms of its crystalline structure, density, etc. Since the relevant, structurally modified regions correspond to one another in terms of their structural modification, a "digital" configuration over the relevant correction layer is realized as a result (i.e., the structure modifications take on one of only two available values—'on' or 'off'). As a result, the manipulation of the layer stress, ultimately obtained by said structural modification or irradiation, can be described as a function of the distance between the relevant structurally modified regions.

In turn, this is advantageous in that, following an appropriate, prior calibration, as yet to be described in more detail below, it is possible to predict which distance or which digital configuration is most suitable for obtaining—or should be generated in order to obtain—a desired layer stress distribution, or a wavefront correction associated with this layer stress distribution.

In principle, influencing the layer stress in an optical element for the purposes of a targeted wavefront correction can also be realized in other ways (e.g., by electrical, magnetic or thermal effects or energy inputs).

The above-described generation of respectively locally restricted, structurally modified regions within the layer has the further advantage that, in the case of a sufficiently small size of the individual locally restricted regions (which could be of the order of 1 µm, for example), the correction layer is not undesirably influenced in its respective layer properties in the remaining regions.

According to one embodiment, the optical element is a mirror.

According to an embodiment, the optical element is configured for an operating wavelength of less than 30 nm, in particular less than 15 nm.

The invention further relates to a method for correcting the wavefront effect of an optical element with the above-described features, the method including the following:

ascertaining a given wavefront effect of the optical element;

depending on the result of this ascertainment, manipulating the wavefront effect on the basis of a model which describes the dependence of the wavefront effect on the local distribution of the layer stress in the correction layer.

According to one embodiment, the ascertaining a given wavefront effect and the manipulation are carried out repeatedly in an iterative process.

According to one embodiment, the model is ascertained using the finite element method. Consequently, the calculation of the figure change resulting from a specific layer stress change can be implemented, for example, by FE methods known from the prior art. In this respect, reference is made in exemplary fashion to the articles D. Yin et al.: "Numerical Modelling of Multilayered Coatings—Latest Developments and Applications" Manufacturing Rev. 2014, 1, 8 Published by EDP Sciences, 2014 DOI: 10.1051/mfreview/2014008 and Xianchao Cheng: "Thermal stress issues in thin film coatings of X-ray optics under high heat load" Physics, Université de Grenoble, 2014, [NNT: 2014GRENY028].

In further embodiments, a calibration can be carried out in advance to set up the model, within the scope of which calibration the change of figure resulting from a certain change in layer stress or the corresponding change in the wavefront effect is ascertained experimentally for certain values. If necessary, such an experimental determination can be carried out for a few sampling points and can be supplemented by a suitable interpolation.

In respect of further preferred embodiments and advantages of the method, reference is made to the above explanations in conjunction with the optical element according to the invention.

The invention further relates to an optical system of a microlithographic projection exposure apparatus, in particular an illumination device or a projection lens, and also to a microlithographic projection exposure apparatus comprising at least one optical element having the features described above.

Further configurations of the invention can be gathered from the description and the dependent claims.

The invention is explained in greater detail below on the basis of exemplary embodiments illustrated in the accompanying figures.

BRIEF DESCRIPTION OF THE DRAWINGS

In detail:

FIGS. 1 and 2A-2C show schematic illustrations for explaining structure and mode of operation of an optical element according to embodiments of the invention, where FIG. 1 shows a mirror with a correction layer impinged by electromagnetic radiation to form (in sectional view) cylindrical modified regions (FIG. 2A) and conical modified regions (FIG. 2B), and FIG. 2C shows (in plan view) a distribution of modified regions;

DETAILED DESCRIPTION

Below, an exemplary construction of an optical element according to the invention is described initially with reference to the schematic illustration shown in FIG. 1.

The embodiments described below share a common feature in that a layer in an optical element such as for example a mirror is used as a correction layer for obtaining a desired figure correction or wavefront effect. More specifically, this layer is subjected to a targeted layer stress change by manipulating the relevant layer structure. In principle, this correction layer could be an additional auxiliary layer introduced into the relevant optical element specifically for the purpose described. However, in further embodiments, a (functional) layer present in the layer structure in any event can additionally be used as a correction layer, and still fall within the scope of the invention.

Figure 1:
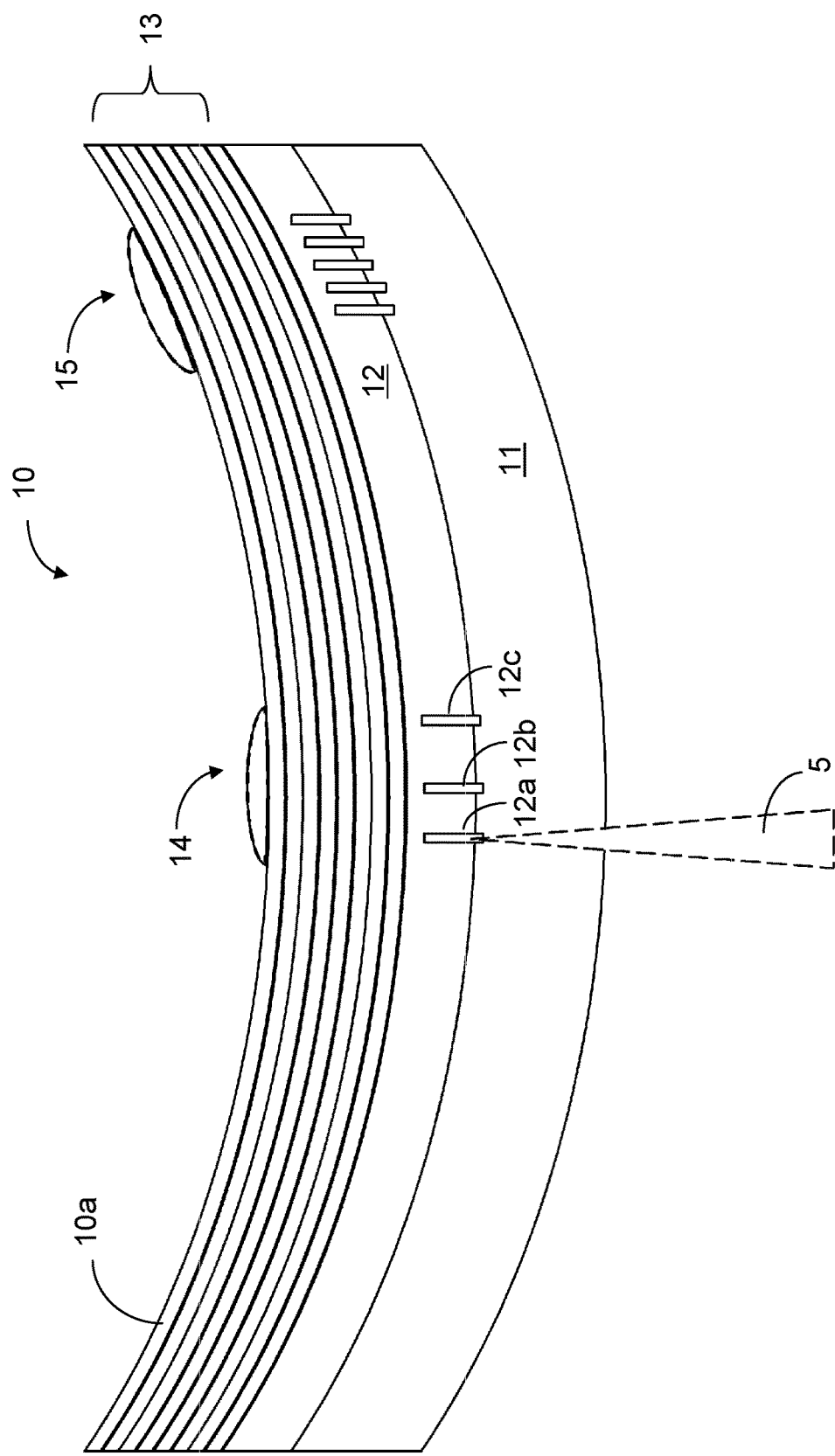

FIG. 1 shows, purely in a schematic illustration, a basic structure rendered possible for an EUV mirror with a mirror substrate 11 and a reflection layer system 13, with, according to the invention, a correction layer 12 formed between the mirror substrate 11 and the reflection layer system 13. The mirror substrate 11 comprises any suitable mirror substrate material, such as ULE®, and, according to the invention and as schematically indicated in FIG. 1, is irradiated with electromagnetic radiation 5 from the (back) side of the mirror 10 facing away from the optically effective surface 10a. The wavelength of this electromagnetic radiation 5 is suitably chosen so that the mirror substrate material is sufficiently transparent to this radiation. In the exemplary embodiment (where ULE® is used as a mirror substrate material), it could be 300 nm, for example.

The correction layer 12 is produced from a layer material chosen such that the electromagnetic radiation 5 has as a consequence a manipulation of the layer stress by way of a structural change within the texture or the crystal structure of said correction layer 12. In principle, recrystallization occurs at different temperatures for virtually all metallic materials (e.g., silver (Ag), copper (Cu), aluminum (Al), nickel (Ni), cobalt (Co)). Here, short pulse laser annealing may be helpful to obtain the desired effect even in the case of high melting point metals such as molybdenum (Mo), for example. Furthermore, suitable phase transformation materials to be mentioned include, for example, binary and ternary alloys such as germanium tellurium antimony (Ge—Te—Sb), indium antimony tellurium (In—Sb—Te), palladium silicon (Pd—Si) or silver tellurium (Ag—Te). In this context, reference is made in exemplary fashion to EP 0 217 293 A1, EP 0 307 750 A1 and U.S. Pat. No. 4,876,667 in respect of suitable materials.

As indicated in FIG. 1, the correction layer 12 can be impinged by electromagnetic radiation 5 as described above in a spatially resolved fashion such that spaced apart regions 12a, 12b, 12c, . . . , equally modified in terms of their respective structures, are generated, wherein the layer stress change generated in the process can be set as desired in a targeted manner by way of the distance between these regions 12a, 12b, 12c, . . . (which can be, e.g., on the order of one or more µm).

The change in layer stress described leads, in turn, to a deformation of the optically effective surface of the mirror 10 (as indicated in regions 14 and 15) and hence to a modification of the figure or of the wavefront effect that can be adjusted in a targeted fashion.

As indicated in FIG. 2A and FIG. 2B, the regions modified in terms of their structure can have any suitable geometry (and, for example, be implemented as regions 12a, 12b, 12c, . . . with, for instance, substantially cylindrical geometry as per FIG. 2A or as regions 22a, 22b, 22c, . . . with, for instance, substantially conical geometry as per FIG. 2B). FIG. 2C shows, purely in a schematic illustration, a view of the relevant distribution of regions modified in terms of their structure, in a plan view from the direction of the substrate.

Figure 3:
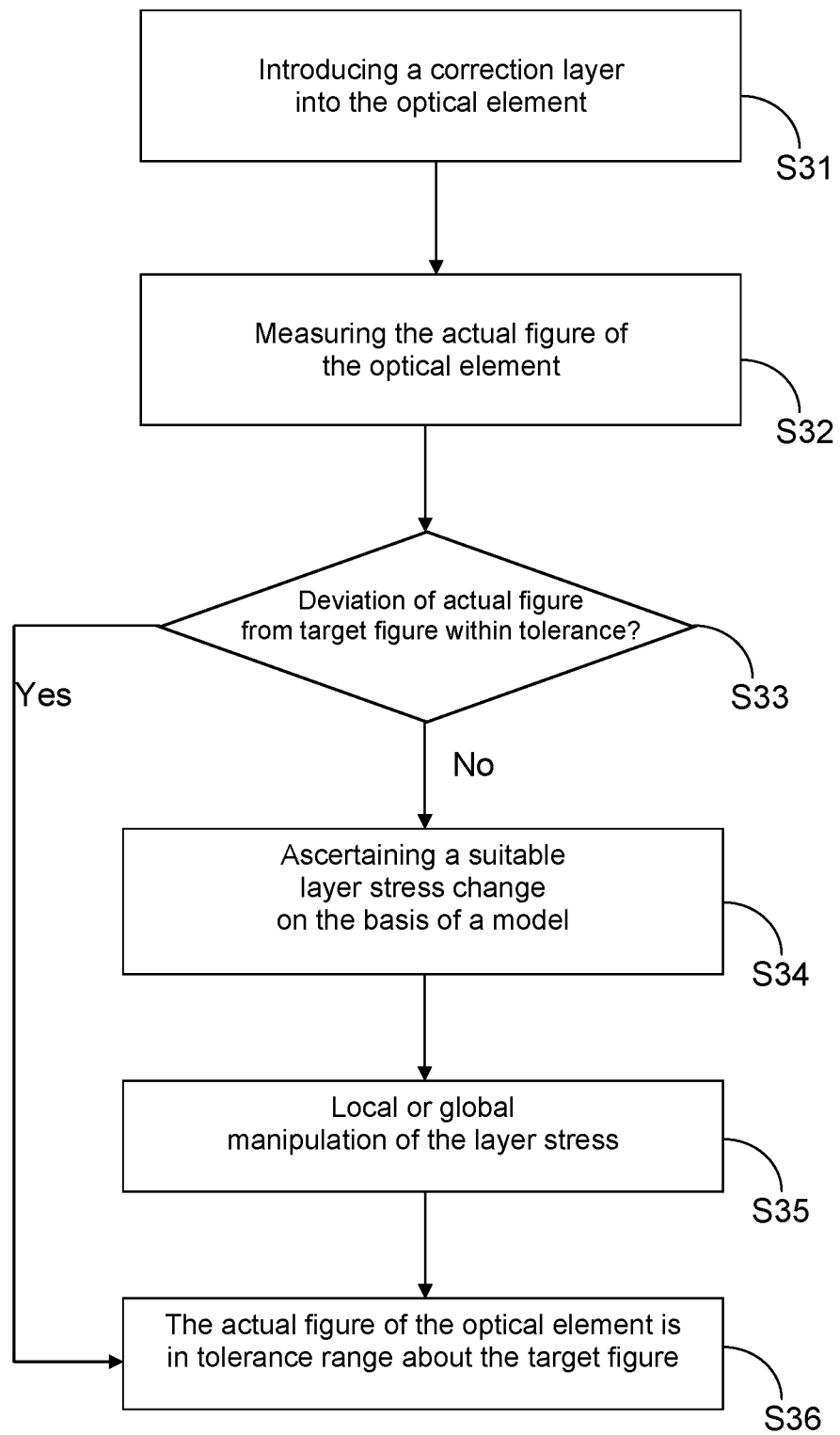
FIG. 3 shows a flowchart for explaining an exemplary sequence of a method according to the invention.

FIG. 3 shows a flowchart for explaining an exemplary sequence of a method according to the invention for correcting the wavefront effect of an optical element such as, e.g., the mirror 10 of FIGS. 1 and 2A-2C.

"S31" initially denotes the step of introducing a correction layer according to the invention into the relevant optical element, carried out during the production of the optical element. Then, in step S32 there is a measurement of the actual figure of the relevant optical element or of the mirror 10 present. In step S33, a check is carried out as to whether the deviation of this actual figure from a specified target figure is below a specified threshold (i.e., still is "within tolerance"). To the extent this is not the case as per the query in step S33, a suitable layer stress change is ascertained in step S34, on the basis of which the previously determined figure deviation can be corrected or the corresponding wavefront effect can be obtained. To this end, use can be made of a suitable model that describes the dependence of the wavefront effect on the local distribution of the layer stress of the correction layer. The relevant model can, in turn, be ascertained using the finite element method or else can be determined experimentally, with a corresponding calibration being performed experimentally in the latter case. In the case of such a calibration, the figure change resulting from a determined layer stress change or the corresponding change in the wavefront effect can be ascertained experimentally for certain values, wherein there can also be an experimental ascertainment for only a few sampling points in conjunction with a suitable interpolation.

In the subsequent step S35, there is the corresponding targeted (local or global) change in the layer stress, for example in the way described on the basis of FIG. 1, whereupon, with a return to step S33, there is another check as to whether the actual figure now is within tolerance and wherein steps S34 and S35 are carried out again when necessary. The above-described iteration is carried out until the optical element or the mirror 10, with its actual figure, is within the tolerance range about the target figure (S36).

In principle, the layer stress in the correction layer can be manipulated in another suitable way by virtue of local or global energetic inputs being brought about, e.g., by way of thermal, electrical, magnetic or other effects in the correction layer.

Figure 4:
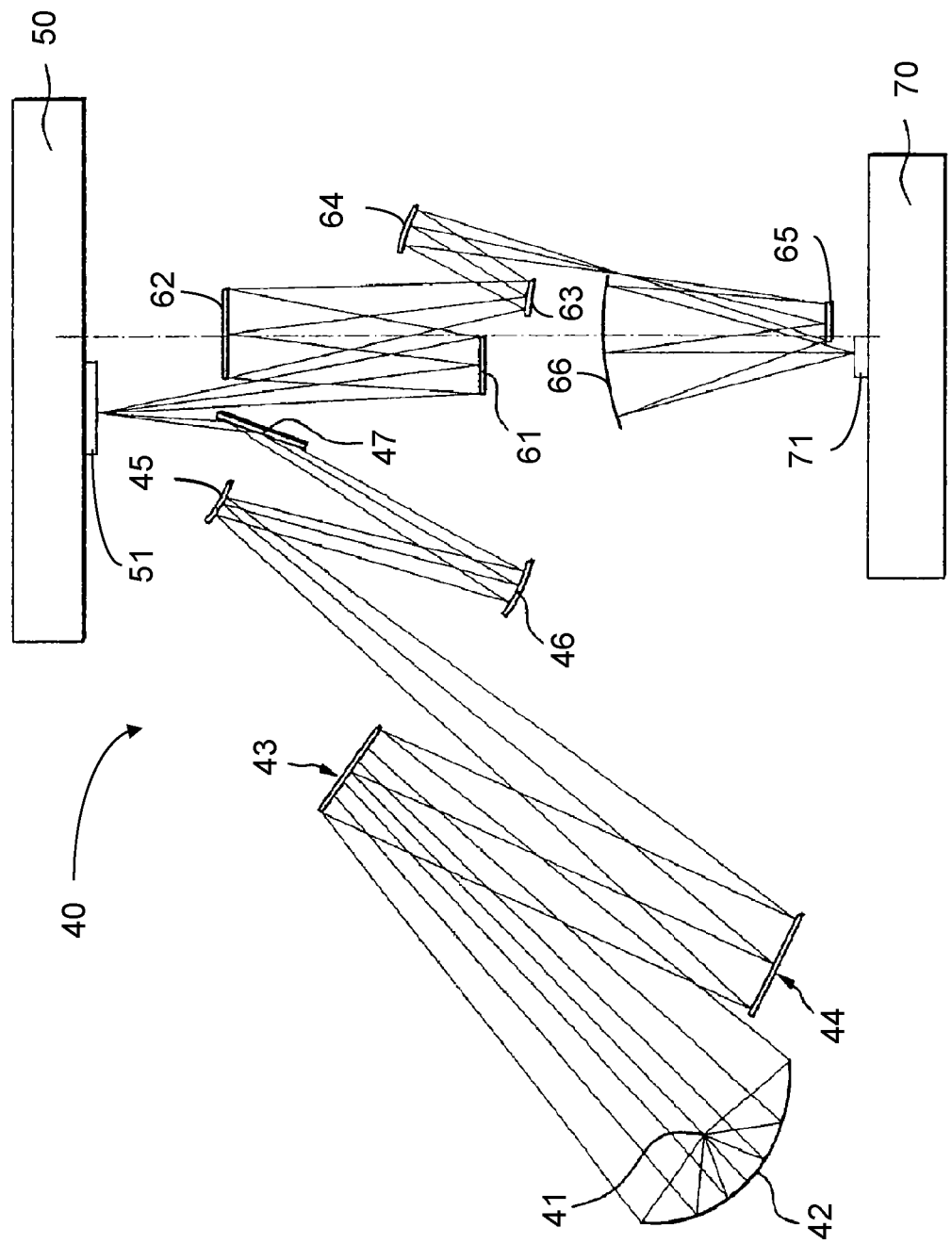
FIG. 4 shows a schematic illustration of an exemplary construction of a microlithographic projection exposure apparatus configured for operation in the EUV.

FIG. 4 shows a schematic illustration of an exemplary projection exposure apparatus which is configured for operation in EUV and which can comprise a wavefront correction element or optical element according to the invention.

According to FIG. 4, an illumination device in a projection exposure apparatus 40 implemented for EUV comprises a field facet mirror 43 and a pupil facet mirror 44. The light from a light source unit comprising, purely by way of example, a plasma light source 41 and a collector mirror 42 is directed onto the field facet mirror 43. A free electron laser (FEL), for example, also can be used as a light source in further embodiments. A first telescope mirror 45 and a second telescope mirror 46 are arranged in the light path downstream of the pupil facet mirror 44. A deflection mirror 47 is arranged downstream in the light path, said deflection mirror directing the radiation that is incident thereon onto an object field in the object plane of a projection lens comprising six mirrors 61-66. At the location of the object field, a reflective structure-bearing mask 51 is arranged on a mask stage 50, said mask being imaged with the aid of the projection lens into an image plane in which a substrate 71 coated with a light-sensitive layer (photoresist) is situated on a wafer stage 70.

Even though the invention has been described on the basis of specific embodiments, numerous variations and alternative embodiments will be apparent to the person skilled in the art, for example through combination and/or exchange of features of individual embodiments. Accordingly, such variations and alternative embodiments are also encompassed by the present invention, and the scope of the invention is restricted only within the meaning of the appended patent claims and equivalents thereof.

What is claimed is:
1. An optical element configured for an optical system, comprising:
    a substrate;
    an optically effective layer system;
    at least one correction layer exhibiting a layer stress, wherein the correction layer is an auxiliary layer provided in addition to the substrate and the optically effective layer system; and
    a manipulator arranged to manipulate the layer stress in the correction layer such that a wavefront aberration present in the optical system is corrected at least partially by the manipulation;
    wherein the manipulator comprises a radiation source arranged for spatially resolved irradiation of the correction layer with electromagnetic radiation; and
    wherein the spatially resolved irradiation produces locally restricted structure modifications within the correction layer, in a plurality of spaced apart regions that are modified mutually equally in terms of their respective structures.

2. The optical element as claimed in claim 1, wherein the manipulation of the layer stress is obtained through the modifications in the layer structure within the correction layer.

3. The optical element as claimed in claim 2, wherein the modifications in the layer structure are at least partially irreversible.

4. The optical element as claimed in claim 2, wherein the manipulation of the layer stress in the correction layer over a lateral distance of 10 mm produces a layer stress modification in the correction layer of at least 10%.

5. The optical element as claimed in claim 1, wherein a distance between the spaced apart regions is determined by the radiation source.

6. The optical element as claimed in claim 1, wherein the optical element is configured as a mirror.

7. The optical element as claimed in claim 1, wherein the optical element is configured for an operating wavelength of less than 30 nm.

8. A method for correcting a wavefront effect of an optical element as claimed in claim 1, comprising:
    a) ascertaining a given wavefront effect of the optical element; and
    b) manipulating the wavefront effect in accordance with a model which describes dependence of the wavefront effect on a local distribution of the layer stress in the correction layer and the ascertained wavefront effect.

9. The method as claimed in claim 8, wherein the ascertaining of the given wavefront effect and the manipulating of the wavefront effect are carried out repeatedly in an iterative process.

10. The method as claimed in claim 8, wherein the model is ascertained with a finite element method.

11. The method as claimed in claim 8, further comprising:
    carrying out a calibration in advance of the ascertaining, to set up the model, within which calibration a change of figure resulting from a given modification in the layer stress or a corresponding modification in the wavefront effect is determined experimentally for given values.

12. The method as claimed in claim 11,
    wherein the experimental determination is implemented for a plurality of sampling points, and
    wherein the method further comprises:
        carrying out interpolation between the sampling points.

13. An optical system of a microlithographic projection exposure apparatus, comprising:
    at least one optical element as claimed in claim 1; and
    additional components of at least one of an illumination device or a projection lens.

14. A microlithographic projection exposure apparatus comprising:
    an illumination device and a projection lens, wherein at least one of the illumination device and the projection lens comprises an optical element as claimed in claim 1.

15. The optical element as claimed in claim 1, wherein the auxiliary layer is formed between the substrate and the optically effective layer system.

* * * * *